United States Patent [19]

Marqués

[11] Patent Number: 5,023,545
[45] Date of Patent: Jun. 11, 1991

[54] CIRCUIT PROBING SYSTEM

[75] Inventor: Anthony M. Marqués, Lexington, Mass.

[73] Assignee: The United States of America, Washington, D.C.

[21] Appl. No.: 532,416

[22] Filed: Jun. 4, 1990

[51] Int. Cl.⁵ .................. G01R 15/12; G01R 31/02
[52] U.S. Cl. .......................... 324/158 P; 324/158 F
[58] Field of Search ............. 324/158 F, 158 P, 72.5, 324/158 R, 74; 371/25.1, 15.1, 20.4, 20.5; 439/482

[56] References Cited

U.S. PATENT DOCUMENTS

| | | | |
|---|---|---|---|
| 1,254,620 | 1/1918 | Newman | 324/76 R |
| 2,059,786 | 11/1936 | Gilbert | 250/204 |
| 2,618,674 | 11/1952 | Stanton | 324/98 |
| 3,072,846 | 1/1963 | Belcher | 324/99 D |
| 3,995,175 | 11/1976 | Hoyt et al. | 307/251 |
| 4,055,801 | 10/1971 | Pike et al. | 371/25.1 |
| 4,092,589 | 5/1978 | Chau et al. | 371/25.1 |
| 4,565,966 | 1/1986 | Burr et al. | 324/158 F |
| 4,651,088 | 3/1987 | Sawada | 324/158 R |
| 4,714,875 | 12/1987 | Bailey et al. | 324/158 F |
| 4,746,855 | 5/1988 | Wrinn | 324/158 F |
| 4,761,607 | 8/1988 | Shiragasawa et al. | 324/158 R |
| 4,791,357 | 12/1988 | Hyduke | 371/25.1 |
| 4,796,259 | 1/1989 | Troy | 324/158 F |

OTHER PUBLICATIONS

Marques, "Probing Chip Nodes with Minimum Disturbance"; Electronics, Aug. 28, 1980; p. 179.

Primary Examiner—Kenneth A. Wieder
Assistant Examiner—Vinh P. Nguyen
Attorney, Agent, or Firm—Robert M. Wohlfarth; John P. Tarlano

[57] ABSTRACT

A probing system for determining a voltage at a node during normal operation of a circuit. An input driver drives the circuit normally. A normal output on an output line associated with the node, is recorded. A probe is brought in contact with the node. Various node voltages are applied to the probe and thus to the node, until the output on the output line matches the recorded output. The probe voltage that creates the match is the voltage at the node, during normal operation of circuit.

3 Claims, 5 Drawing Sheets

CIRCUIT PROBING SYSTEM

FIELD OF THE INVENTION

The present invention relates to a feedback type circuit probing system. The probing system can probe a node of an operating circuit. The probing system can determine the operating characteristics of the circuit, at that node.

BACKGROUND OF THE INVENTION

Various non-feedback type probing systems have been used in the past, in an attempt to determine the operating voltage or voltages at a given node of the circuit. These non-feedback type probing systems do not dynamically balance an operating voltage, at a node of a circuit, with a voltage on a probe.

An article by the present inventor shows a non-feedback circuit. The circuit is used manually. The circuit is used prior to a probe being connected to a node. The circuit is used to lower transient currents while the probe is being connected to the node. The article is in Electronics magazine, dated Aug. 28, 1980, at page 179.

The present invention improves the balancing capabilities of a circuit probing system. In the present invention, means are provided to dynamically balance a voltage or voltages on a probe, with a voltage or voltages on a node. Means are provided to monitor the output of a circuit under investigation, while the circuit is being probed. Feedback means are provided to continuously adjust the voltage on the probe, in order to accomplish such dynamic balancing. During such dynamic balancing the output of the circuit is in a condition equivalent to its normal unprobed condition. In a dynamically balanced condition, little or no transient current will flow between the probe and the node.

SUMMARY OF THE INVENTION

A probing system for a circuit comprising an input means for operating a circuit, the circuit having an output line and an associated node and means for applying an initial test probe voltage signal to the node of the operating circuit, the circuit producing a corresponding test line output signal on the output line.

DESCRIPTION OF THE PREFERRED EMBODIMENT

Figure 1:
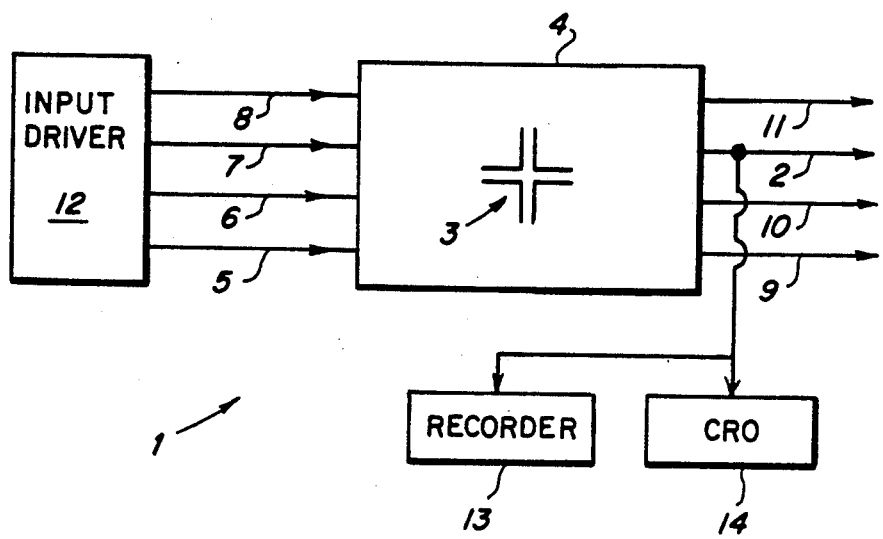
FIG. 1 is a block diagram of a subsystem for producing and recording a normal output signal of a circuit, in the circuit's unprobed condition.

FIG. 1 shows a subsystem 1 for recording a normal line output signal on a output line 2 that is associated with a node 3 of a circuit 4. The circuit 4 may have many nodes such as node 3. Nodes are points of intersection of circuit paths within circuit 4. The circuit 4 may be an integrated circuit. The circuit 4 may have many inputs lines, such as lines 5, 6, 7 and 8. The circuit 4 may have many output lines such as lines 9, 10, 2 and 11.

An input signal is applied to each input line from an input driver 12. The input driver 12 causes the circuit 4 to operate, producing a normal line output signal on line 2, as well as the other output lines. The output line 2 is connected to a recorder 13 and to a cathode ray oscilloscope 14.

FIG. 1 shows tapped output line 2. Line 2 provides a normal line output signal that is indicative of the voltage value or values on node 3, when node 3 is not being probed. The normal line output signal on line 2 is associated with electrical behavior at node 3 of circuit 4.

Circuit 4 may have circuit components such as transistors and resistors. Circuit 4 may also have other circuit components such as capacitors and inductors. Intersections of internal leads within circuit 4 form circuit node 3. Contact leads, to circuit components within circuit 4, may also form circuit nodes that are similar to node 3. Node 3 will have a voltage characteristic dependent upon a voltage characteristic of the input signal coming into the circuit 4 from input driver 12, and on the components within the circuit 4.

The normal line output signal on line 2 may be monitored by cathode ray oscilloscope 14. Such an oscilloscope 14 may have a high impedance, so that it does not disturb the output characteristics of circuit 4.

Figure 3:
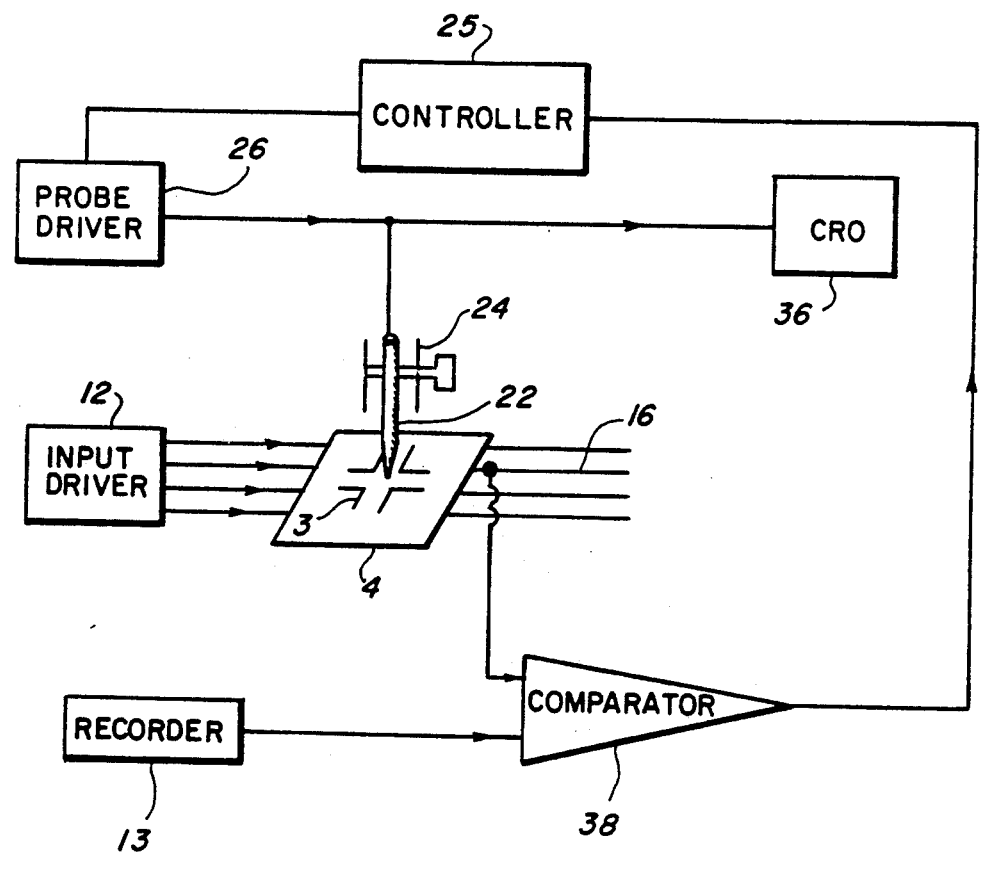
FIG. 3 is a block diagram of a circuit probing system for determining a wide voltage at a node of a circuit.
Figure 2:
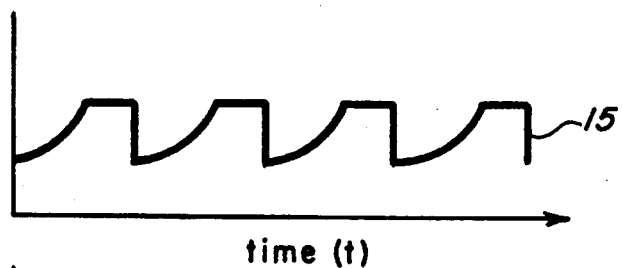
FIG. 2 is a series of normal output signals produced by the subsystem of FIG. 1.

A normal line output signal 15, on line 2, is shown in FIG. 2. The normal line output signal 15 is in response to a normal input signal being transmitted from driver 12. The normal line output signal 15 is recorded on a recording device, such as tape recorder 13. The recorded normal line output signal 15 will be played back from recorder 13 when the node 3 of circuit 4 is being probed, as shown in FIG. 3. The normal line output signal 15 is used as a reference signal.

FIG. 3 shows a feedback type node probing system 18. System 18 has a probe 22. Probe 22 is placed in contact with the node 3 while circuit 4 is operating. Alternately a probe may be capacitively coupled with node 3. Such capacitive coupling would be effective, due to the operation of circuity 4. As such, a capacitively coupled probe need not be in direct physical contact with node 3, to interact with node 3. Micromanipulator 24 may be used to accurately place the probe 22 on the node 3 of circuit 4. Micromanipulator 24 may alternately be used with a capacitively coupled probe.

Figure 4A:
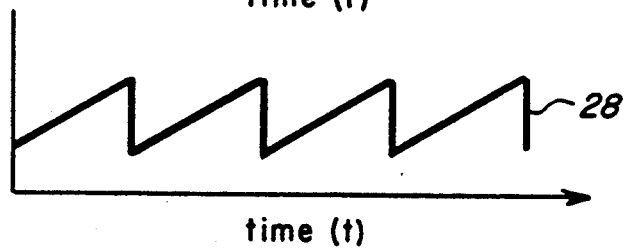
FIG. 4A is a series of first probe voltage signals produced by the system of FIG. 3.
Figure 4B:
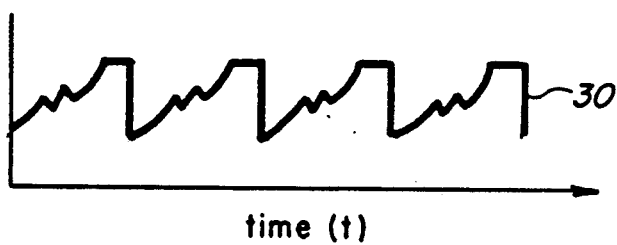
FIG. 4B is a series of first test output signals produced by the system FIG. 3.

Under the control of controller 25, a probe driver 26 places a selected first test probe voltage signal on probe 22 and therefore on node 3, in a first probe test. The probe 22 is in electrical contact with node 3. First test probe voltage signal 28 is shown in FIG. 4A. A first test line output signal 30 comes out of circuit 4 on line 2. The first test line output signal 30 is shown in FIG. 4B. The controller 25 directs probe driver 26 to generate first test probe voltage signal 28.

A cathode ray oscilloscope 36 may be connected to probe 22 to monitor the first test probe signal 28 placed on probe 22 by probe driver 26.

Figure 5A:
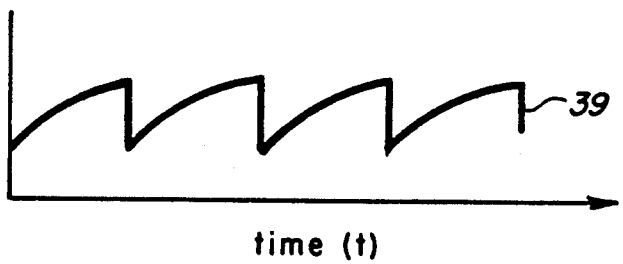
FIG. 5A is a series of second probe voltage signals produced by the system of FIG. 3.
Figure 5B:
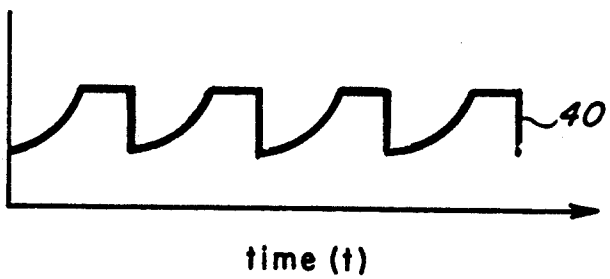
FIG. 5B is a series of second test output signals produced by the system of FIG. 3.

As first test probe voltage signal 28 is placed on node 3, first test line output signal 30, on line 2, is sensed. The first test line output signal 30 is sent to comparator 38. The recorded normal line output signal 15 is also sent to comparator 38 from recorder 13. The first test line output signal 30 and the normal line output signal 15 are compared by comparator 38. A resulting comparator output signal, from comparator 38, is sent to controller 25. Based on this comparator output signal, controller 25 directs probe driver 26 to generate a second test probe voltage signal 39 shown in FIG. 5A. At this time, the controller 25 causes a second test output signal 40 to come out on line 2, in a second probe test. Second test output signal 40 is shown in FIG. 5B. In an attempt to have probed circuit 4 duplicate signal 15, controller 25 causes the probe driver 26 to generate the new second test probe voltage signal 39.

The controller 25 may have a computer therein, the computer being programmed to analyze the comparator output signal and choose a test probe voltage signal based on the analysis. The controller 25 will direct the probe driver 26 to generate a test probe voltage signal that is chosen by the computer. By a computer directed trial and error method, a test probe voltage signal is produced that will cause a match between a generated test line output signal and the normal line output signal 15.

After a generated test output signal is produced and a match with signal 15 occurs, the test probe voltage signal that produces the match is taken to be the voltage pattern at the node 3. This is because that particular test probe voltage signal will mirror the node voltage on node 3 under normal operation of circuit 4, causing circuit 4 to behave as though it is unprobed, with respect to the output on line 2. Due to such a mirroring, there will be no flow of current into or out of the probing system 18 from node 3. Due to such a mirroring, the circuit 4 will not be disturbed from its normal operation, with respect to the output on line 2.

Again, the voltage on the probe 22 of FIG. 3 is changed, until no transient current goes into or out of the probing system 18. If there were no change procedure, a transient current could otherwise flow, until an applied voltage on the probe 22 changes to equal the voltage on the node 3. By using an adjustable variable probe voltage, a circuit 4, such as a logic circuit, will not be disturbed or otherwise changed in its logic state during probing.

Figure 6C:
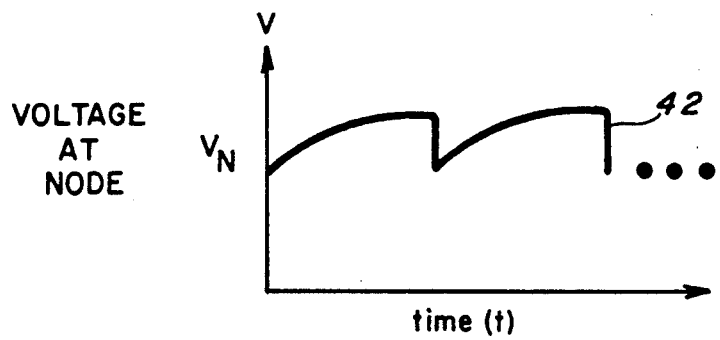
FIG. 6A shows a transient current flow when there is a mismatch between a probe voltage of FIG. 6B and a node voltage of FIG. 6C.
Figure 6B:
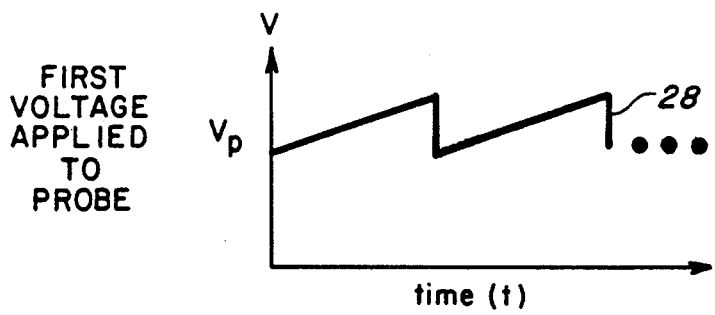
Figure 6A:
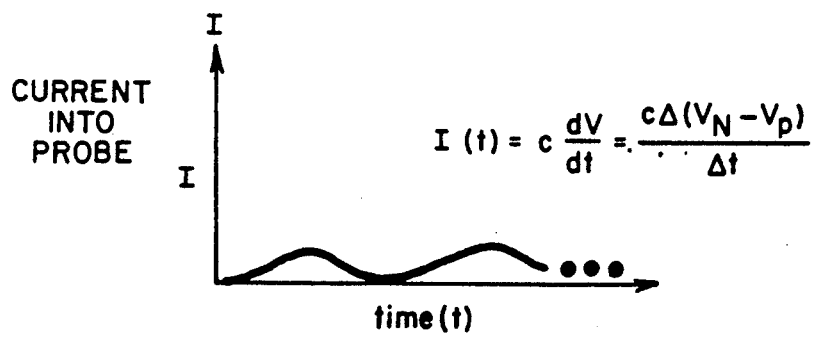

FIG. 6A shows a current flow into the probing system 18 when there is not a match between a test probe voltage signal 28, of FIG. 6B and FIG. 4A, and a true node voltage 42 shown in FIG. 6C. At this time the voltage 28 on the probe 22 does not match or equal the voltage 42 at the node 3.

Figure 7C:
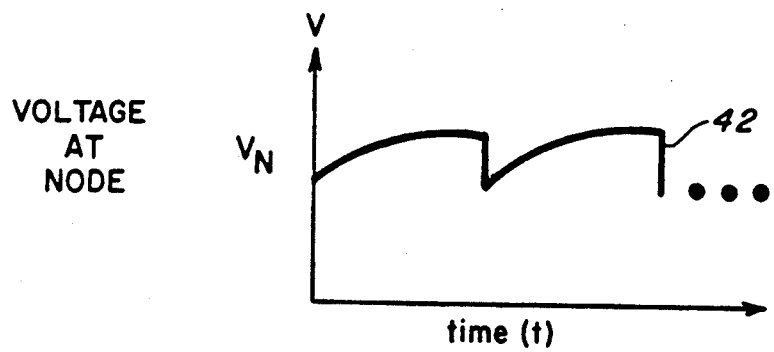
FIG. 7A shows a lack of a transient current flow when there is a match between a probe voltage of FIG. 7B and a node voltage of FIG. 7C.
Figure 7B:
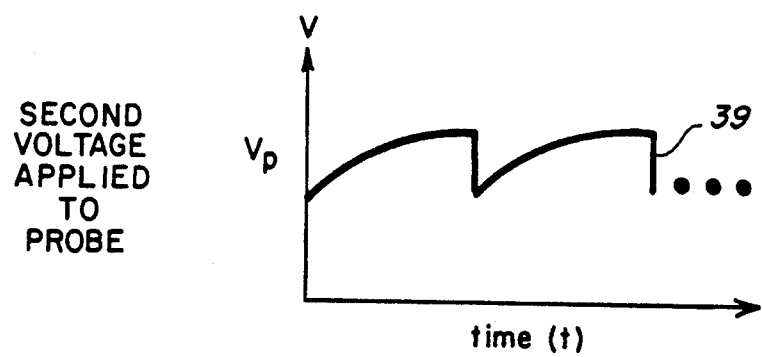
Figure 7A:
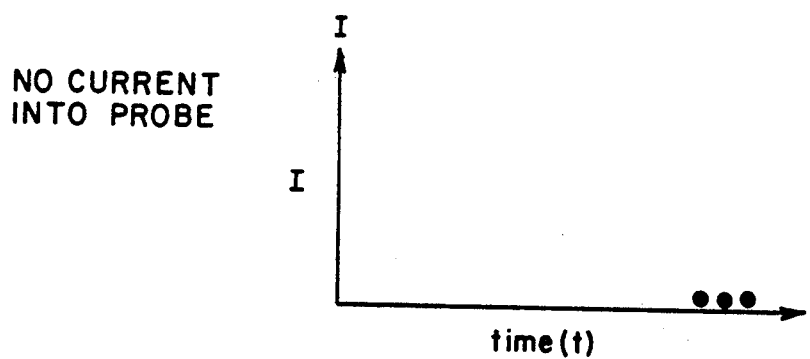

FIG. 7A shows a lack of a current flow into the probing system 18 when there is a match. The test probe voltage signal 39, of FIG. 7B and FIG. 5A, on the probe 22, matches, or equals, the node voltage 42 shown in FIG. 7C. One can precisely determine the node voltage 42 as shown in FIG. 7C. The voltage 42 at the node 3 equals the voltage signal 39 being applied to it from the probing system 18.

Figure 8:
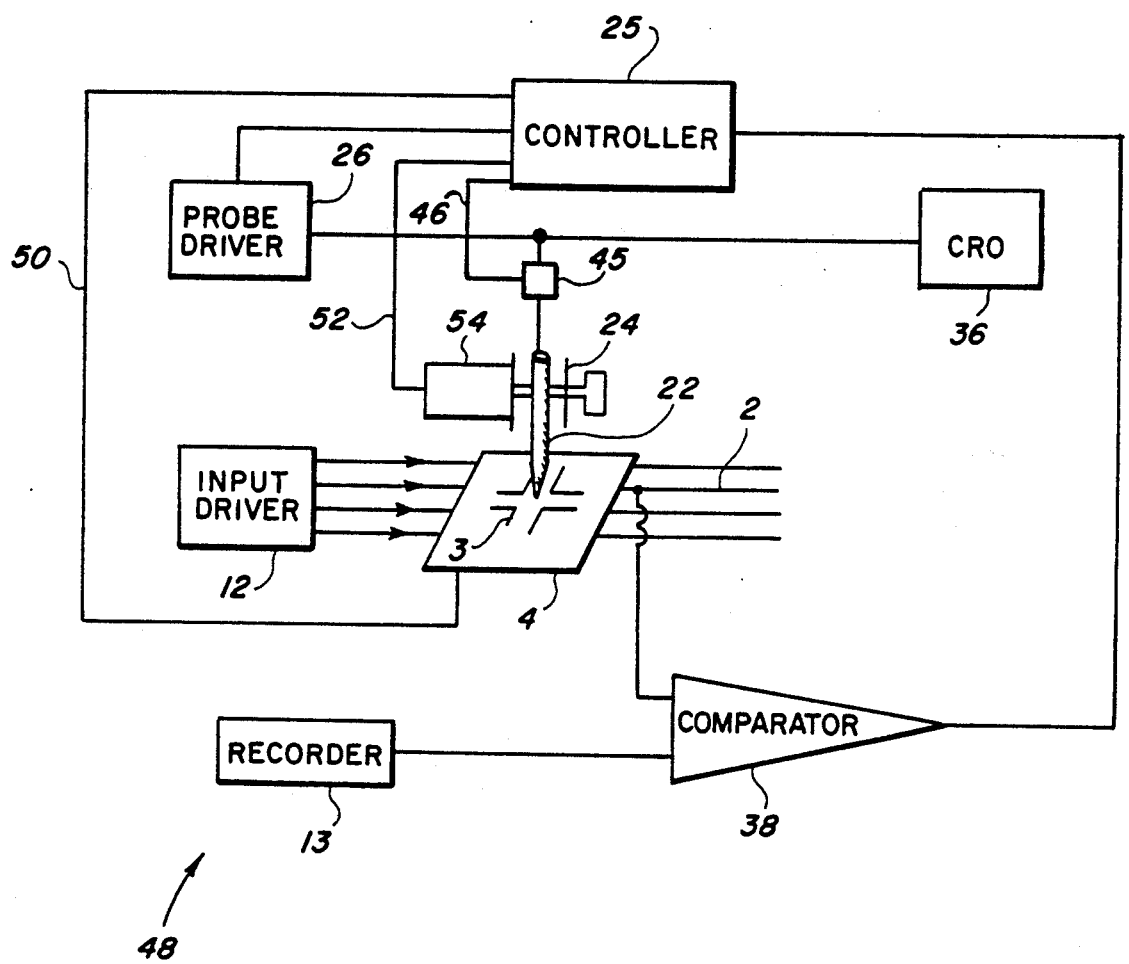
FIG. 8 is a block diagram of a circuit probing system having a relay, a reset line and a removal line.

The circuit of FIG. 8 has additional means to the circuit of FIG. 3. A relay 45 is shown in FIG. 8. Relay 45 promotes the resetting of circuit 4 after a probe test. Relay 45 is closed to allow a selected probe voltage signal to be sent from probe driver 12 to node 3. A signal is sent over line 46 from controller 25 to relay 45 to cause relay to close. Relay 45 may be a selonoid operated relay. After a probe test, relay 45 is opened to allow any charge on node 3 to be removed from node 3.

Depending on the type of circuit that circuit 4 is, circuit 4 might change its state during a probing procedure. Therefore system 48 of FIG. 8 has a reset line 50 between controller 25 and circuit 4. The reset line 50 would be used to send a reset command from controller 25 to circuit 4 after a probe test. Use of such a reset line would be quite helpful if circuit 4 is undergoing a multiple number of probe tests, as described above.

Instead of using reset line 50, a turn-off line (not shown) could be provided between controller 25 and input driver 12, to turn off driver 12. With such a turn-off line, driver 12 could be turned off after a probe test so that circuit 4 might reset itself, after a probe charge leaks off of node 3.

In order to reset circuit 4, it might, alternatively, be necessary to physically remove probe 22 from circuit 4, after a probe test. This would be done so that any charge that is on probe 22 would be removed from node 3. If a fully automatic probing system is used, a removal line 52 would be used to send a removal command from controller 25 to motor 54. One would be able to determine that circuit 4 had become reset, after a probe test, since a null signal would be emitted from comparator 38. Micromanipulator 24 would be moved upward by motor 54, under the direction of the removal command on removal line 52, to physically remove probe 22.

While the present invention has been disclosed in connection with the preferred embodiment thereof, it should be understood that there may be other embodiments which fall within the spirit and scope of the invention as defined by the following claims.

What is claimed is:

1. A probing system for a circuit, comprising:
   (a) input means for operating a circuit normally, the circuit having an output line and an associated node;
   (b) probe means in contact with the node for applying an initial test probe voltage signal to the node of the operating circuit in a first probe test, the circuit producing a corresponding test output signal on the output line;
   (c) means for providing a recorded normal line output signal for the input means;
   (d) comparator means for comparing the test line output signal on the output line with the recorded normal line output signal and for providing a comparator output signal based on the comparison; and
   (e) controller means for changing the test probe voltage signal based on the comparator output signal, said probe means for providing probe tests continuing until the comparator output signal reaches a null value.

2. A probing system for a circuit, comprising:
   (a) means for operating a circuit normally, the circuit having an output line and an associated node;
   (b) probe means in electrical contact with the node;
   (c) probe driver means for applying an initial test probe voltage signal to the probe means in a first probe test, the circuit producing a corresponding test line output signal on the output line;
   (d) means for providing a recorded normal line output signal for the input means;

(e) comparator means for comparing the test line output signal on the output line with the recorded normal line output signal and for providing a comparator output signal based on the comparison; and (f) controller means for changing the test probe voltage signal based on the comparator output signal, said probe means for providing probe tests continuing until the comparator output signal reaches a null value.

3. A probing system for a circuit, comprising:

(a) input means for operating a circuit normally, the circuit having an output line and an associated node;

(b) probe means in electrical contact with the node (c) probe driver means for applying an initial test probe voltage signal to the probe means in a first probe test, the circuit producing a corresponding test line output signal on the output line;

(d) means for providing a recorded normal line output signal for the input means;

(e) comparator means for comparing the test line output signal on the output line with the recorded normal line output signal and for providing a comparator output signal based on the comparison; and (f) controller means having a computer therein for causing the probe driver means to change the test probe voltage signal based on the comparator output signal, said probe means for providing probe tests continuing until the comparator output signal reaches a null value, the controller removing the probe means after each probe test.

* * * * *